(12) United States Patent
Morimoto et al.

(10) Patent No.: US 7,893,345 B2
(45) Date of Patent: Feb. 22, 2011

(54) THERMOELECTRIC MODULE DEVICE (75) Inventors: Akihiro Morimoto, Toyota (JP); Takahiro Kimura, Hekinan (JP)

(73) Assignee: Aisin Seiki Kabushiki Kaisha, Kariya-shi (JP)

( * ) Notice: Subject to any disclaimer, the term of this patent is extended or adjusted under 35 U.S.C. 154(b) by 257 days.

(21) Appl. No.: 11/753,123

(22) Filed: May 24, 2007

(65) Prior Publication Data

US 2007/0272291 A1  Nov. 29, 2007

(30) Foreign Application Priority Data

May 25, 2006  (JP) ............................... 2006-145590

(51) Int. Cl.
*H01L 35/28* (2006.01)
(52) U.S. Cl. ..................................... 136/203
(58) Field of Classification Search ................. 136/203, 136/204
See application file for complete search history.

(56) References Cited

U.S. PATENT DOCUMENTS

| | | | |
|---|---|---|---|
| 5,724,818 A | 3/1998 | Iwata et al. | |
| 5,865,031 A | 2/1999 | Itakura | |
| 5,936,192 A | 8/1999 | Tauchi | |
| 5,966,939 A | 10/1999 | Tauchi | |
| 6,225,548 B1 | 5/2001 | Sakakibara et al. | |
| 6,727,423 B2 | 4/2004 | Tauchi et al. | |

FOREIGN PATENT DOCUMENTS

| | | | |
|---|---|---|---|
| JP | 3627719 | | 12/2004 |
| JP | 2004343146 A | * | 12/2004 |
| JP | 2005079210 A | * | 3/2005 |
| JP | 2006108507 A | * | 4/2006 |

* cited by examiner

*Primary Examiner*—Jessica L Ward
*Assistant Examiner*—Jacky Yuen
(74) *Attorney, Agent, or Firm*—Oblon, Spivak, McClelland, Maier & Neustadt, L.L.P.

(57) ABSTRACT

A thermoelectric module device includes a first substrate having inner and outer surfaces, a second substrate having inner and outer surfaces, a Peltier-junction module sandwiched between the inner surfaces of the first and second substrates, the Peltier-junction module being made up of a series of Peltier junctions including a pair of outermost Peltier junctions, a pair of power supply electrodes connected to the pair of the outermost Peltier junctions, respectively, and a metallization layer provided on the outer surface of the second substrate for being soldered to a package, the metallization layer being divided into spaced first and second portions which correspond to the Peltier-junction module and the pair of power supply electrodes, respectively.

4 Claims, 9 Drawing Sheets

| Model | Solder for Pre-soldering ||| Shape of Metallization Layer ||| Analysis Result |
|---|---|---|---|---|---|---|---|
| | Sn/Ag/Cu | Sn/Zn | Bi/Sn | Divided Type A | Divided Type B | Not Divided | |
| M1 | O | | | O | | | O |
| M2 | | O | | O | | | O |
| M3 | | | O | O | | | O |
| M4 | O | | | | O | | O |
| M5 | O | | | | | O | × |
| M6 | | O | | | | O | × |

F I G. 5

| | No. | Resistance Value [Ω] | | Difference [%] | Evaluation |
|---|---|---|---|---|---|
| | | Before Pre-Soldering | After Pre-Soldering | | |
| M1 | 1 | 1.723 | 1.746 | 1.33 | ○ |
| | 2 | 1.710 | 1.728 | 1.05 | |
| | 3 | 1.706 | 1.726 | 1.17 | |
| | 4 | 1.712 | 1.727 | 0.88 | |
| | 5 | 1.715 | 1.733 | 1.05 | |
| M4 | 1 | 1.719 | 1.721 | 0.12 | ○ |
| | 2 | 1.708 | 1.711 | 0.18 | |
| | 3 | 1.722 | 1.728 | 0.35 | |
| | 4 | 1.709 | 1.714 | 0.29 | |
| | 5 | 1.715 | 1.719 | 0.23 | |
| M5 | 1 | 1.713 | 1.771 | 3.39 | × |
| | 2 | 1.707 | 1.800 | 5.45 | |
| | 3 | 1.718 | 1.794 | 4.42 | |
| | 4 | 1.720 | 1.798 | 4.53 | |
| | 5 | 1.704 | 1.771 | 3.93 | |

FIG. 8

THERMOELECTRIC MODULE DEVICE

CROSS REFERENCE TO RELATED APPLICATIONS

This application is based on and claims priority under 35 U.S.C. S119 with respect to Japanese Patent Application No. 2006-145590, filed on May 25, 2006, the entire content of which is incorporated herein by reference.

FIELD OF THE INVENTION

The present invention is generally directed to a thermoelectric module device.

BACKGROUND OF THE INVENTION

Japanese Patent No. 3627719 discloses one of thermoelectric modules that have been known. The thermoelectric module device contains, therein: thermoelectric elements such as in-series multiple Peltier elements; an upper substrate bonded to the thermoelectric elements; and a lower substrate arranged facing the upper substrate and bonded to the thermoelectric elements. The lower substrate has two surfaces, a first surface facing the upper substrate and a second surface positioned on the other side of the upper substrate. The first surface of the lower substrate is bonded to the thermoelectric elements and is mounted with electrodes for supplying electric current to the thermoelectric elements.

The second surface of the lower substrate is provided with a metallization layer via which the lower substrate is mounted on a package (case) by soldering. The lower substrate includes a junction bonded to the thermoelectric elements and a power supply portion mounted thereon with the electrodes. The thermoelectric elements connect the junction of the lower substrate to the upper substrate.

Upon mounting the thermoelectric module device onto the package, pre-soldering is occasionally implemented, by which solder is bonded to the metallization layer of the lower substrate beforehand, in order to simplify a mounting operation. During the pre-soldering process, the thermoelectric module device, which has the upper substrate, the lower substrate and the thermoelectric elements, is compelled to receive heat. In such circumstances, the lower substrate may distort due to a possible large difference in coefficient of thermal expansion between a coefficient of thermal expansion of the soldering material and the one of the lower substrate. Here, stress may be applied to the junction of the lower substrate or to the thermoelectric elements per se.

Especially, the power supply portion of the lower substrate, which is not connected to the upper substrate, is inferior in rigidity to the junction of the lower substrate, which is connected to the upper substrate. This structure of the thermoelectric module causes distortion in the power supply portion more than in the junction of the lower substrate and can apply an excessive amount of stress to the junction between the lower substrate and the thermoelectric elements.

The present invention has been made in view of the above circumstances and provides a thermoelectric module device in which stress applied to thermoelectric elements is reduced.

SUMMARY OF THE INVENTION

An aspect of the present invention provides a thermoelectric module device which comprises:

a first substrate having inner and outer surfaces;

a second substrate having inner and outer surfaces, the second substrate being arranged in parallel to the first substrate such that the inner surfaces of the first and second substrates are in opposition to each other;

a Peltier-junction module sandwiched between the inner surfaces of the first and second substrates, the Peltier-junction module being made up of a series of Peltier junctions including a pair of outermost Peltier junctions;

a pair of power supply electrodes connected to the pair of the outermost Peltier junctions, respectively; and a metallization layer provided on the outer surface of the second substrate for being soldered to a package, the metallization layer being divided into spaced first and second portions which correspond to the Peltier-junction module and the pair of power supply electrodes, respectively.

BRIEF DESCRIPTION OF THE DRAWINGS

The foregoing and additional features and characteristics of the present invention will become more apparent from the following detailed description considered with reference to the accompanying drawings, wherein.

DETAILED DESCRIPTION OF THE INVENTION

Hereinafter an embodiment of the present invention will be described in great detail with reference to the attached drawing figures.

Figure 1A:
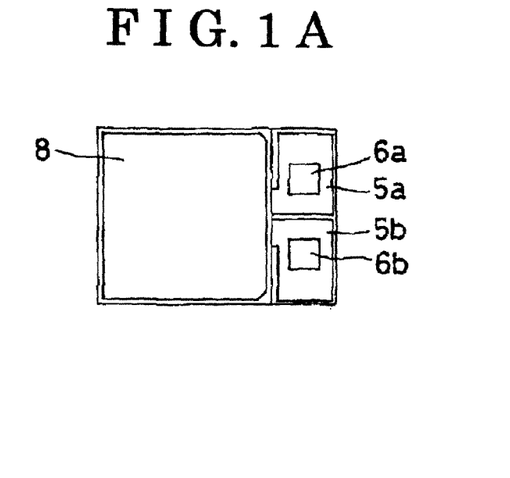
FIG. 1A is an aerial view illustrating a thermoelectric module device according to an embodiment of the present invention.
Figure 1B:
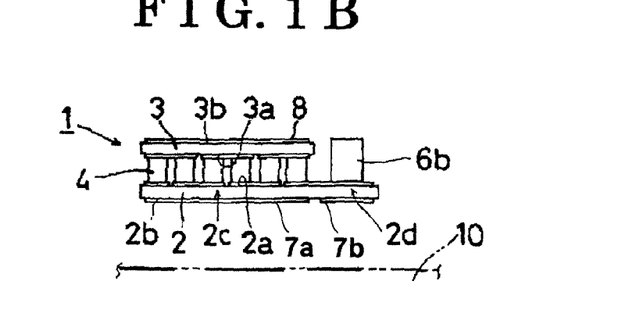
FIG. 1B is a side view of the thermoelectric module shown in FIG.1A.
Figure 1C:
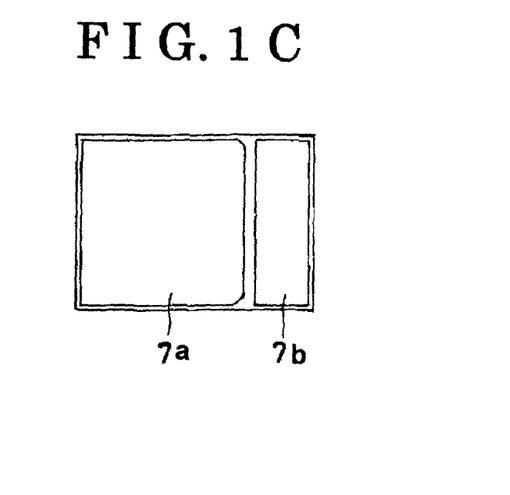
FIG. 1C is a bottom view of the thermoelectric module device shown in FIG. 1A.

Referring first to FIGS. 1A, 1B, and 1C, there is illustrated a thermoelectric module device 1 according to an embodiment of the present invention. The thermoelectric module device 1 includes a first substrate 3, a second substrate 2 which is arranged in parallel to the first substrate 3, and a Peltier-junction module 4 sandwiched or held between an inner surface 3a of the first substrate 3 and an inner surface 2a of the second substrate 2.

As is well known, the Peltier-junction module 4 is made up of a series of Peltier junctions which includes a pair of outermost Peltier junctions 5a and 5b. Except for the outermost junctions 5a and 5b, each Peltier junction is in the form of a electrode which connects opposite ends of neighboring upstanding Peltier elements and which is adhered or bonded to either of the inner surface 3a of the first substrate 3 and the inner surface 2a of the second substrate 2.

A pair of power supply electrodes 6a and 6b are fixed to or provided on the pair of outermost Peltier junctions 5a and 5b, respectively. Each of the power supply electrodes 6a and 6b is, as will be detailed later, in the form of a post or column.

As can be seen from FIGS. 1A, 1B, and 1C, though the first substrate 3 is almost equal to the second substrate 2 in width, the first substrate 3 is smaller in length than the second substrate 2. Thus, a right portion of the inner surface 2a of the second substrate 2 is out of opposition to the inner surface 3a of the first substrate 3. The top end of each of the column-shaped power supply electrodes 6a and 6b placed on the right portion of the second substrate 2 is generally in line with the outer surface 3b of the first substrate 3.

Each of the Peltier junction is formed by patterning a Cu-plated layer on the inner surface 3a (2a) of the first substrate 3 (second substrate 2). Instead, the Cu-layer is formed by the followings steps: forming a thin-film metallization layer on the inner surface 3a (2a) of the first substrate 3 (second substrate 2), patterning such a layer into a specific shape, forming a Cu layer on the thin-film metallization layer, and removing a bare portion of the thin-film metallization layer (i.e. a portion of the thin-film metallization layer which is not coated with the Cu layer).

Figure 6:
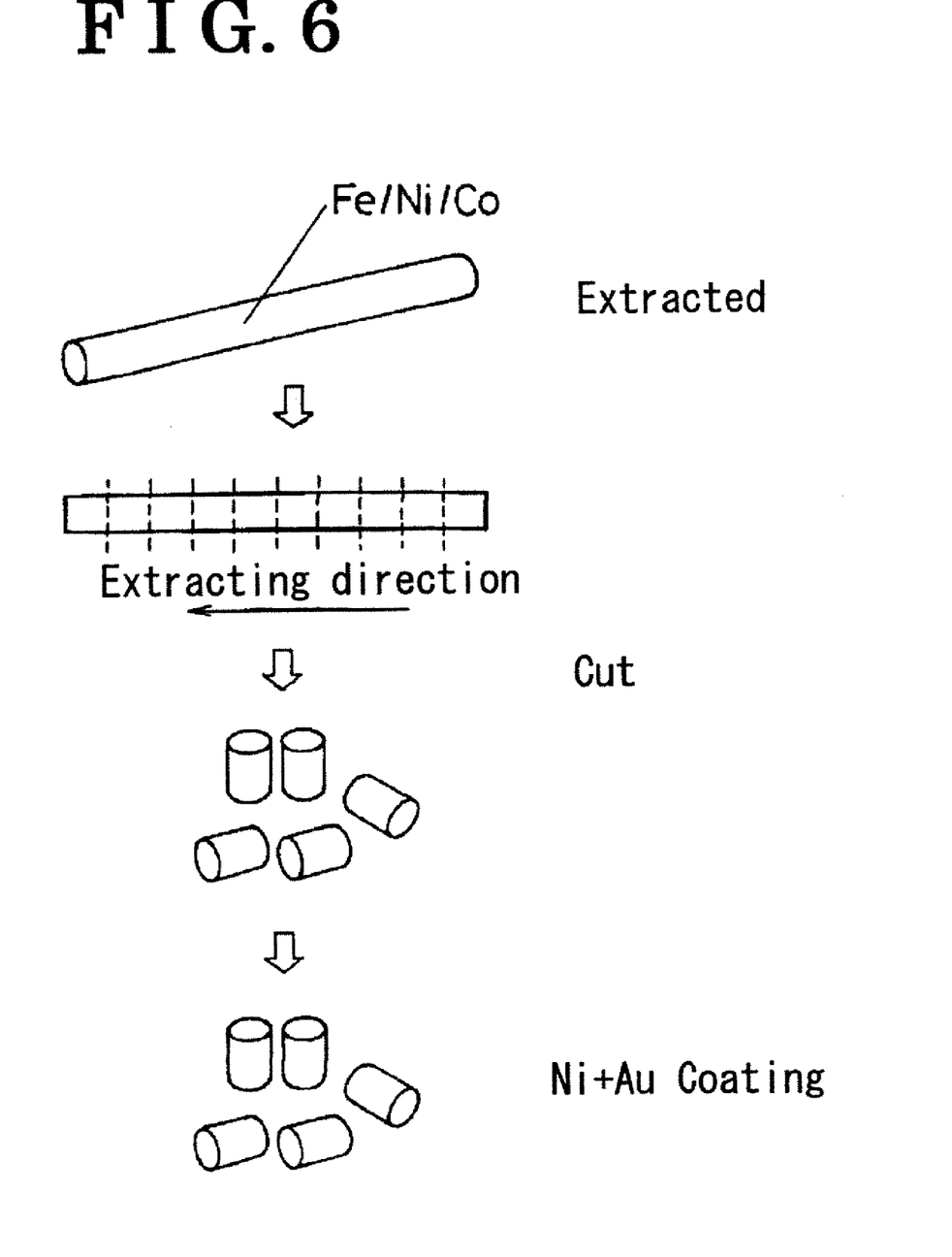
FIG. 6 is a view illustrating a process of manufacturing a column-shaped electrode.
Figure 7:
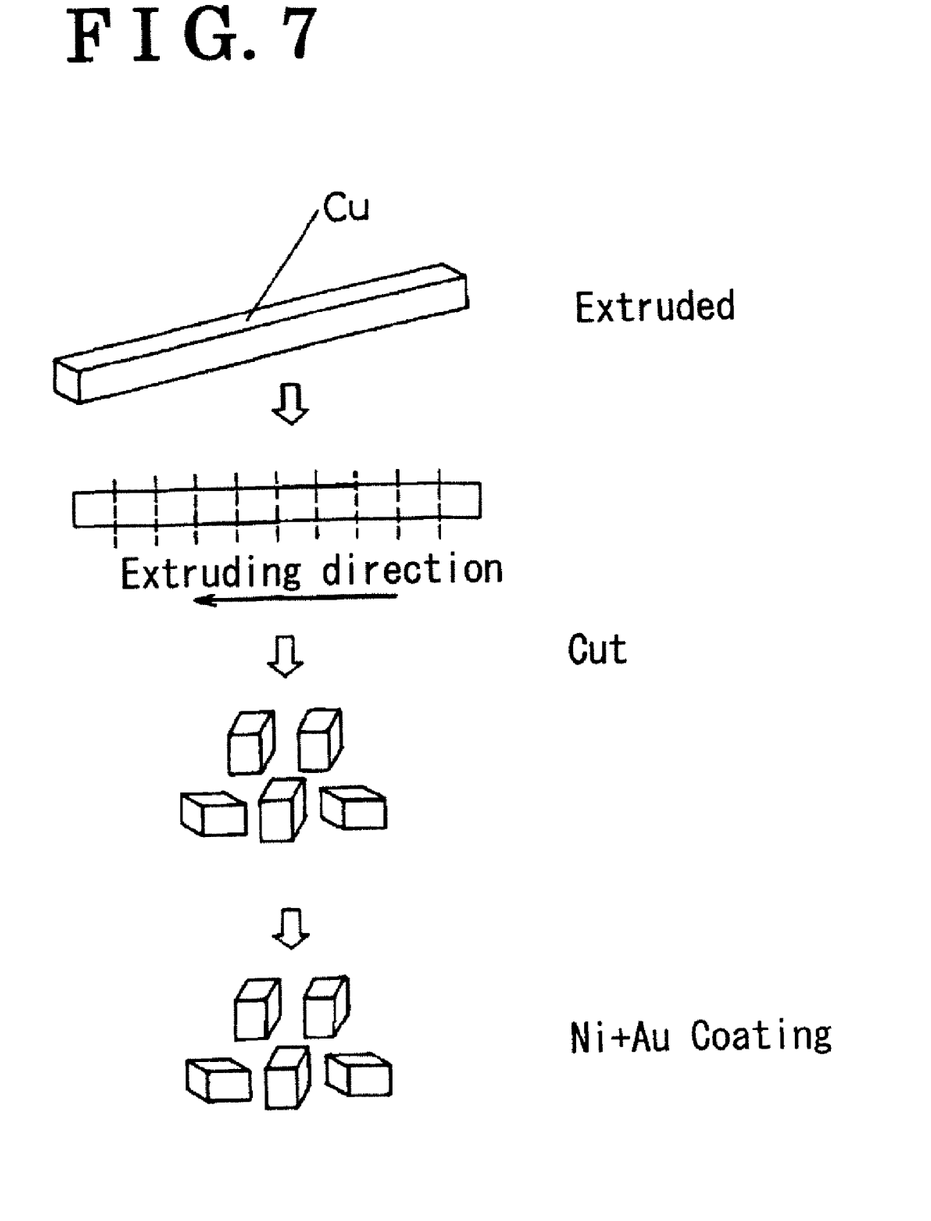
FIG. 7 is a view illustrating another process of manufacturing the column-shaped electrode.

Referring now to FIG. 6, there is illustrated how each of the power supply electrodes 6a and 6b is produced. First, with extraction process, a round bar member with a diameter of 0.4 mm is prepared which is an alloy of Fe, Ni, and Co. Such a round bar member is cut into a length of, say, 1 mm. The resulting piece is coated with Ni and thereafter is coated with gold, thereby formation of each of the power supply electrodes 6a and 6b. An alternative method for producing each of the power supply electrodes 6a and 6b is illustrated in FIG. 7. In this method, with extraction process, a square Cu bar member of 0.6 mm×0.6 mm is prepared.; Such a bar member is cut into a length of, say, 1.5 mm. The resulting piece is coated with Ni and thereafter is coated with gold, thereby formation of each of the power supply electrodes 6a and 6b. Other than Cu and alloy of Fe, Ni, and Co, as raw materials of each of the power supply electrodes 6a and 6b, other electrically conductive materials are available which include Al, Ni, an alloy of Cu and W, Au, Ag, Pt, and Fe.

Figure 8:
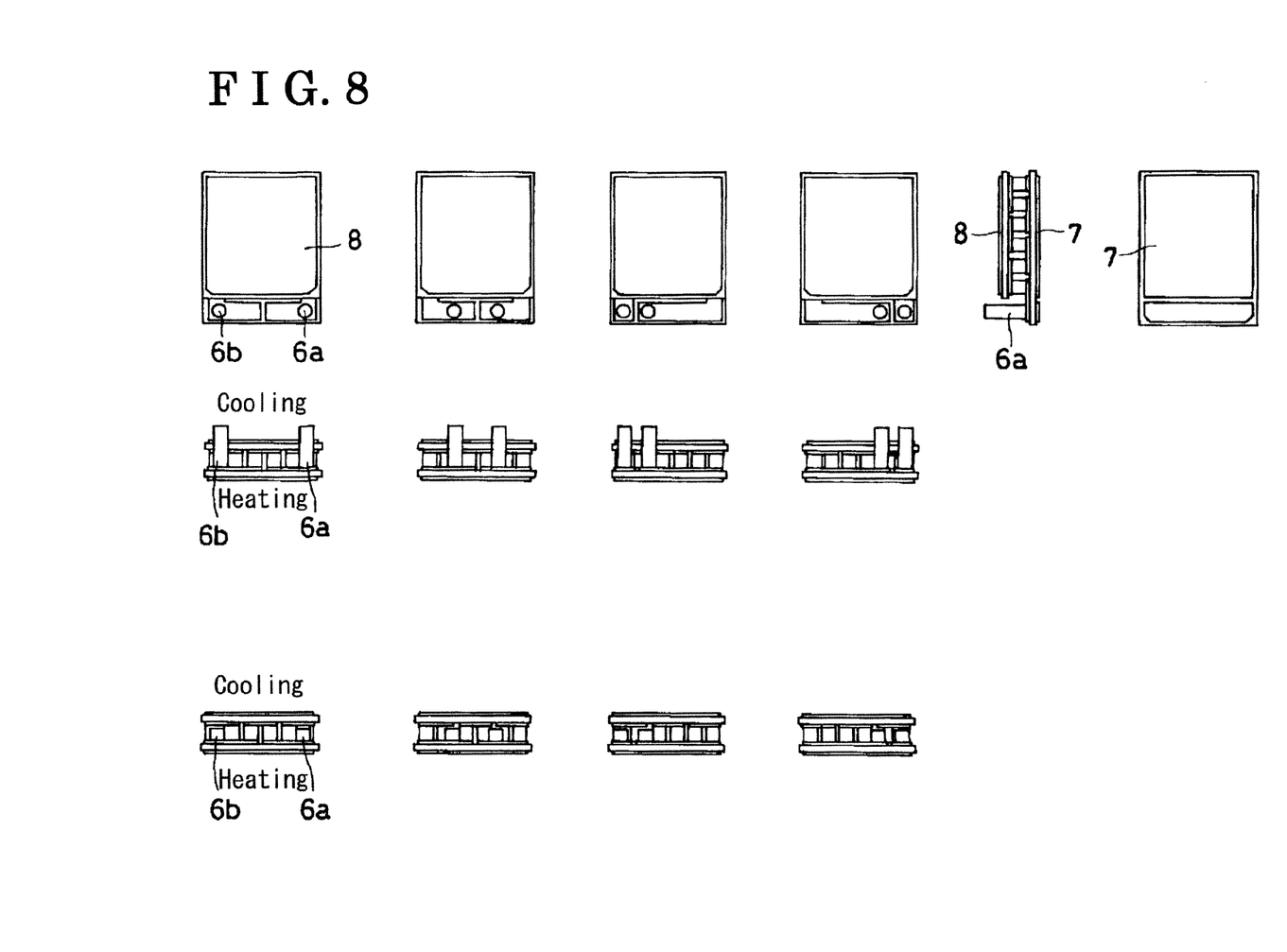
FIG. 8 is a view illustrating arrangement examples of the column-shaped electrodes.
Figure 9:
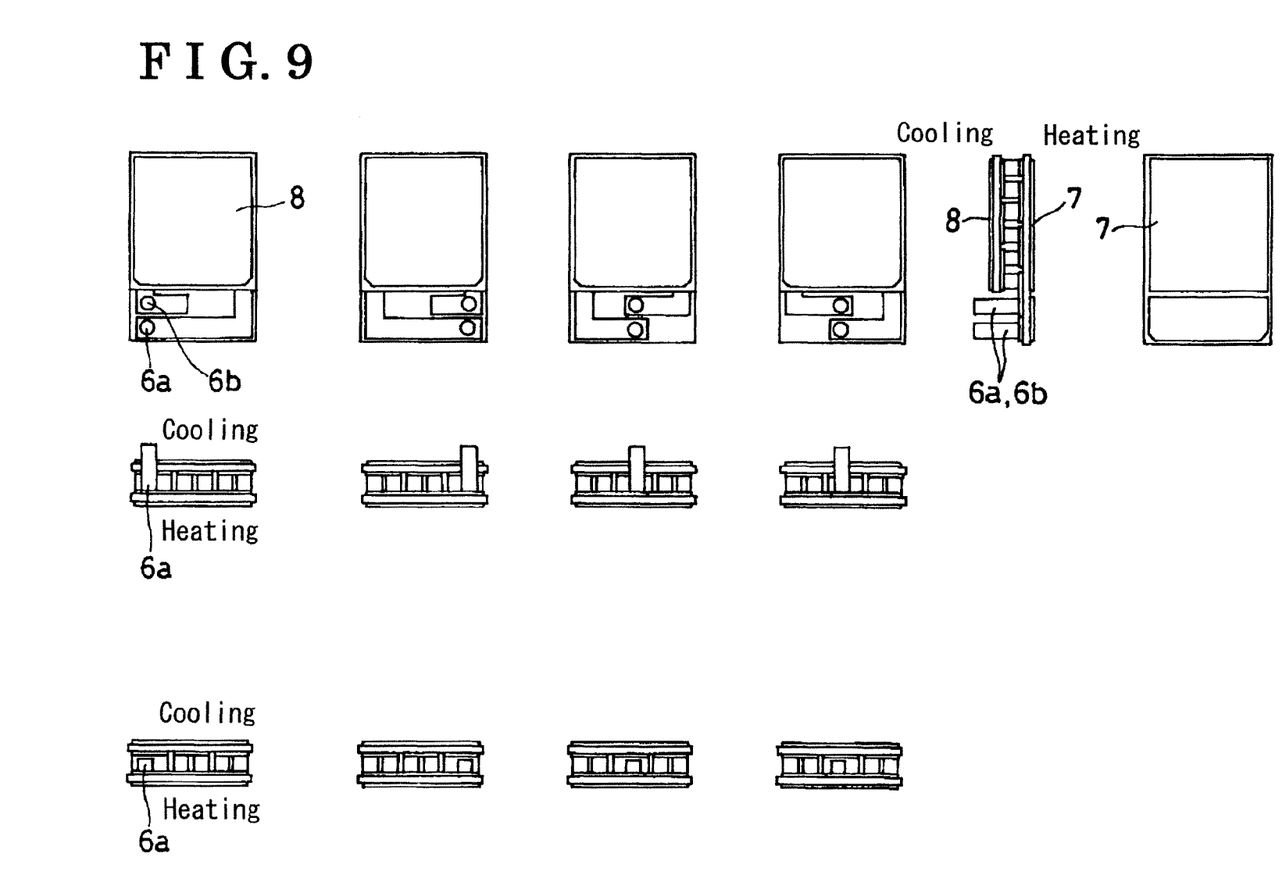
FIG. 9 is a view illustrating another arrangement examples of the post electrodes.
Figure 10:
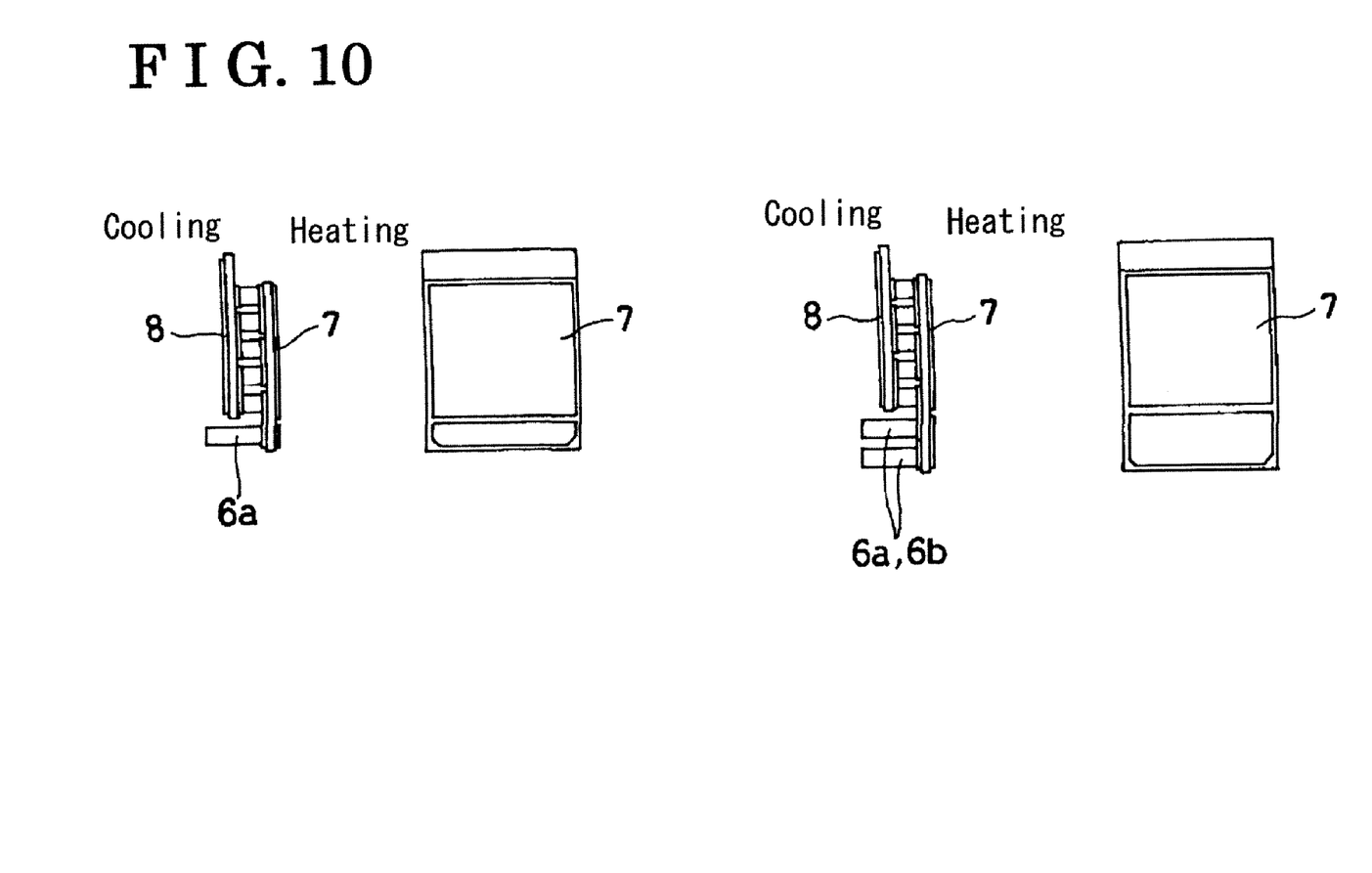
FIG. 10 is a view illustrating still another arrangement examples of column-shaped electrodes.

Thus produced or manufactured power supply electrodes 6a and 6b are placed on the respective outermost Peltier junctions 5a and 5b and are soldered thereto. Different or alternative modes of how the power supply electrodes 6a and 6b are arranged are illustrated in FIGS. 8 through 10.

In the thermoelectric module device 1, on the outer surface 2b of the first substrate 2, there is provided a metallization layer 7 for the soldering connection between a package 10 and the thermoelectric module device 1. On the other hand, on the outer surface 3b of the second substrate 3, there is provided a metallization layer 8 for the soldering connection between the thermoelectric module device 1 and elements such as an LD (semiconductor laser diode) and thermistor. The metallization layer 7 (8) is, for example, in the form of three-layer structure of Cu, Ni, and Au layers coated or plated on the substrate 2 (3).

Figure 2A:
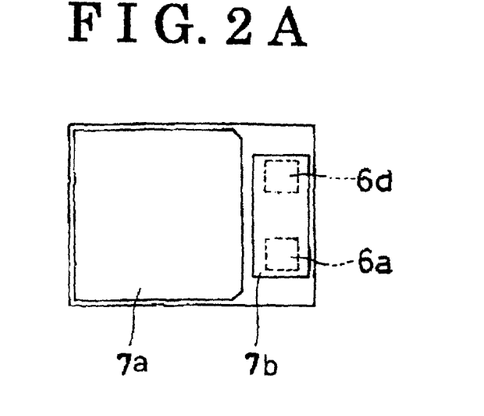
FIG. 2A is one of examples of the shape of a metallization layer.
Figure 2B:
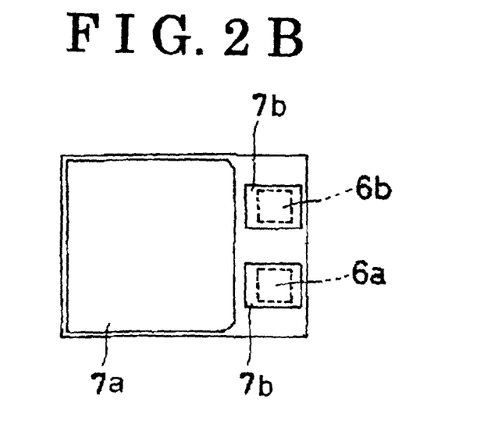
FIG. 2B is another example of the shape of the metallization layer.

The metallization layer 7 is divided into spaced first and second portions 7a and 7b which correspond to the Peltier-junction module 4 and the pair of power supply electrodes 6a and 6b, respectively. In other words, a connecting portion 2c and a power supply portion 2d are defined in the first substrate 2 which correspond to the Peltier-junction module 4 and the power supply electrodes 6a and 6b, respectively. The first portion 2c of the second substrate 2 cooperates with the first substrate 3 to sandwich the Peltier-junction module. As shown in FIG. 2A, the second portion 7b of the metallization layer 7 is formed to correspond to both of the power supply electrodes 6a and 6b. Instead, as shown in FIG. 2B, the second portion 7b of the metallization film 7 may be divided into spaced halves to correspond to the respective power supply electrodes 6a and 6b.

For confirming remarkable merits or advantages which are derived from the structure of the thermoelectric module device 1 in which the metallization layer 7 is divided into plural portions, experiments were conducted or performed by using six examples or model devices M1 thru M6.

Each of the model devices M1 thru M6 includes a cooling substrate which is similar to the first substrate 3, a heat-radiating substrate which is similar to the second substrate 2, and a Peltier-junction module sandwiched between the cooling and heat-radiating substrates. The cooling substrate is in the form of an alumina ceramics plate having dimensions of 3.3 mm×3.3 mm×0.2 mm (thickness) and having a coefficient of linear expansion of $7.2 \times 10^{-6}$/K. The heat-radiating substrate is in the form of an alumina ceramics plate having dimensions of 3.3 mm×3.3 mm×0.4 mm (thickness) and having a coefficient of linear expansion of $7.2 \times 10^{-6}$/K. The Peltier-junction module has dimensions of 3.3 mm×3.3 mm×0.4 mm (thickness) and is made up of 36 pieces or 18 pairs of in-series Peltier elements whose raw material is Bi—Te family. For adhering or bonding one (the other) end of each of the Peltier elements to the cooling (heat-radiating) substrate, an Au80/Sn20 solder is employed whose melting point, coefficient of linear expansion, and Young's modulus are 280 degrees in Centigrade, $17.5 \times 10^{-6}$/K, and 60 Mpa, respectively.

For pre-soldering a metallization layer or film on each heat-radiation substrate to its corresponding module, three kinds of solders are prepared. The solders are:

Sn96.5/Ag3.0/Cu0.5 solder (melting point: 217° C., coefficient of linear expansion: $21.7 \times 10^{-6}$/K)

Sn91/Zn9 solder (melting point: 198° C., coefficient of linear expansion: $24.2 \times 10^{-6}$/K)

Figure 3:
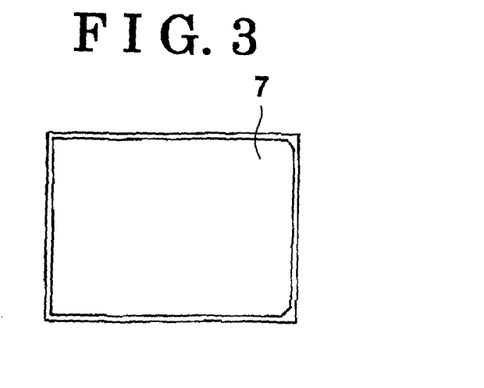
FIG. 3 is a comparative example of the shape of the metallization layer.

Bi58/Sn42 solder (melting point: 138° C., coefficient of linear expansion: $24.2 \times 10^{-6}$/K), The shape of the metallization film is selected from a divided type-A as shown in FIG. 2A, a divided type-B as shown in FIG. 2B, and a one-piece type (i.e. not divided) as shown in FIG. 3.

Figure 4:
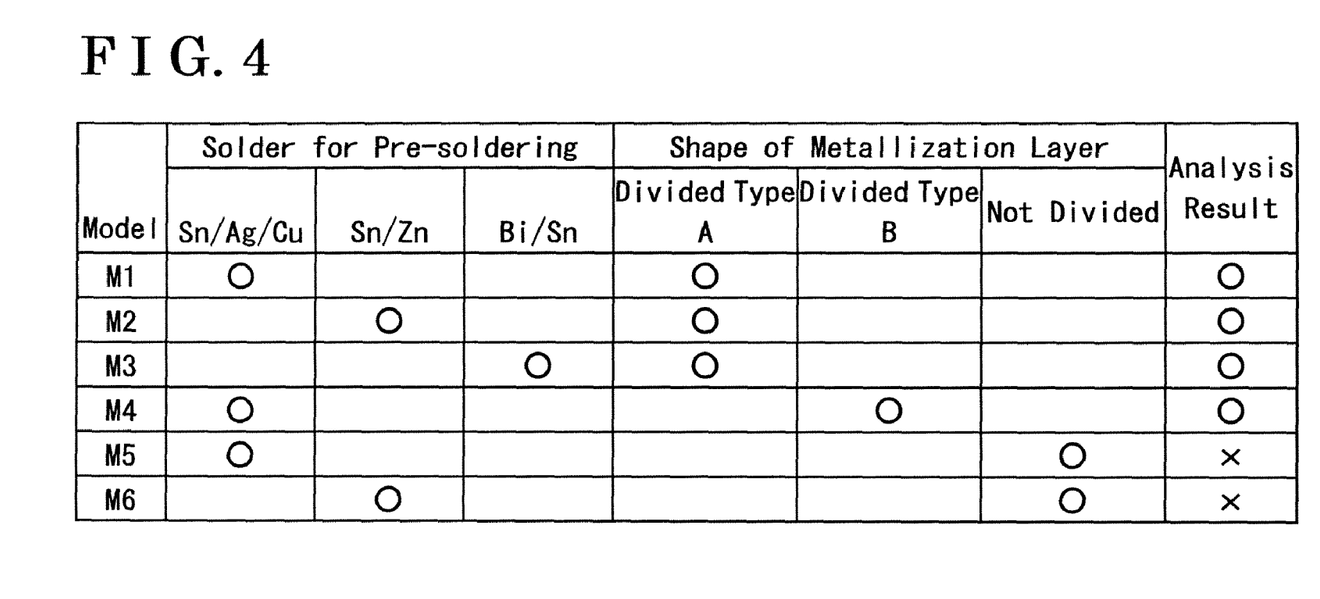
FIG. 4 is a table for explaining the results of stress analysis.

In FIG. 4, selected solder for pre-soldering and employed shape of the metallization layer or film are indicated with open circles for each of the models M1 thru M6.

The models M1 thru M6 were brought into experiments to determine stresses applied to the thermoelectric module devices when the respective solders are provided or applied thereto. These soldering operations are made prior to a soldering connection between each of the thermoelectric module devices and its corresponding package and therefore are said to be pre-soldering operations.

The results are indicated in the right column of the table in FIG. 4 based on the criteria that when the maximum stresses applied to the Peltier-junction module is found to be less (greater) than 280 Mpa, the model thermoelectric module device is evaluated to be acceptable (not acceptable) as indicated with ○(×). As readily understood from the FIG. 4—shown table, the model devices M5 and M6 each having the not-divided or one-piece metallization layer film are determined to be not acceptable. On the contrary, all the model devices M1 thru M4 are found to be acceptable even upon pre-soldering operation. The reason is as follows. As previously mentioned, the second substrate 2 is an integral combination of the connecting portion 2c which is connected to the first substrate 3 via the Peltier-junction module 4 and the power supply portion 2d on which the power supply electrodes 6a and 6b are provided. In such a structure, the connecting portion 2c is more rigid than the power supply portion 2d, which results in that if the coefficient of linear expansion of the metallization layer 7 is larger than that of the first substrate 2 the thermal stress applied to the power supply portion 2d of the first substrate 2 when the metallization layer 7 is divided into plural portions is made considerably smaller than the thermal stress applied to the power supply portion 2d of the first substrate 2 when the metallization layer 7 is not divided. In brief, separation of the metallization layer 7 into the spaced first portion 7a and second portion 7b makes the power supply portion 2d of the first substrate 2 free from the thermal expansion of first portion 7a of the metallization layer 7, thereby reducing the thermal stress of the power supply portion 2d of the first substrate 2 upon pre-soldering operation.

Next, five pieces of each of the model devices M1, M4, and M5 were produced for measuring or determining, with well-known four-terminal method, how pre-soldering operation changes the internal resistive value in each model device. The results are indicated in Table shown in FIG. 5. When the resistive change rate is found to be within (outside) the range of ±2%, the resistive change rate measured model device is judged or evaluated to be acceptable as indicated with ○(×).

As to each pieces of the model device M4 which is manufactured to have a smaller area of the second portion 7b of the metallization layer 7 when compared to the model device 1, the resistive change rate of each piece of the model device M4 is successfully reduced. Such results are in agreement with the results indicated in FIG. 4—shown table, which proves that the above mentioned stress analysis tests are of precision.

Figure 5:
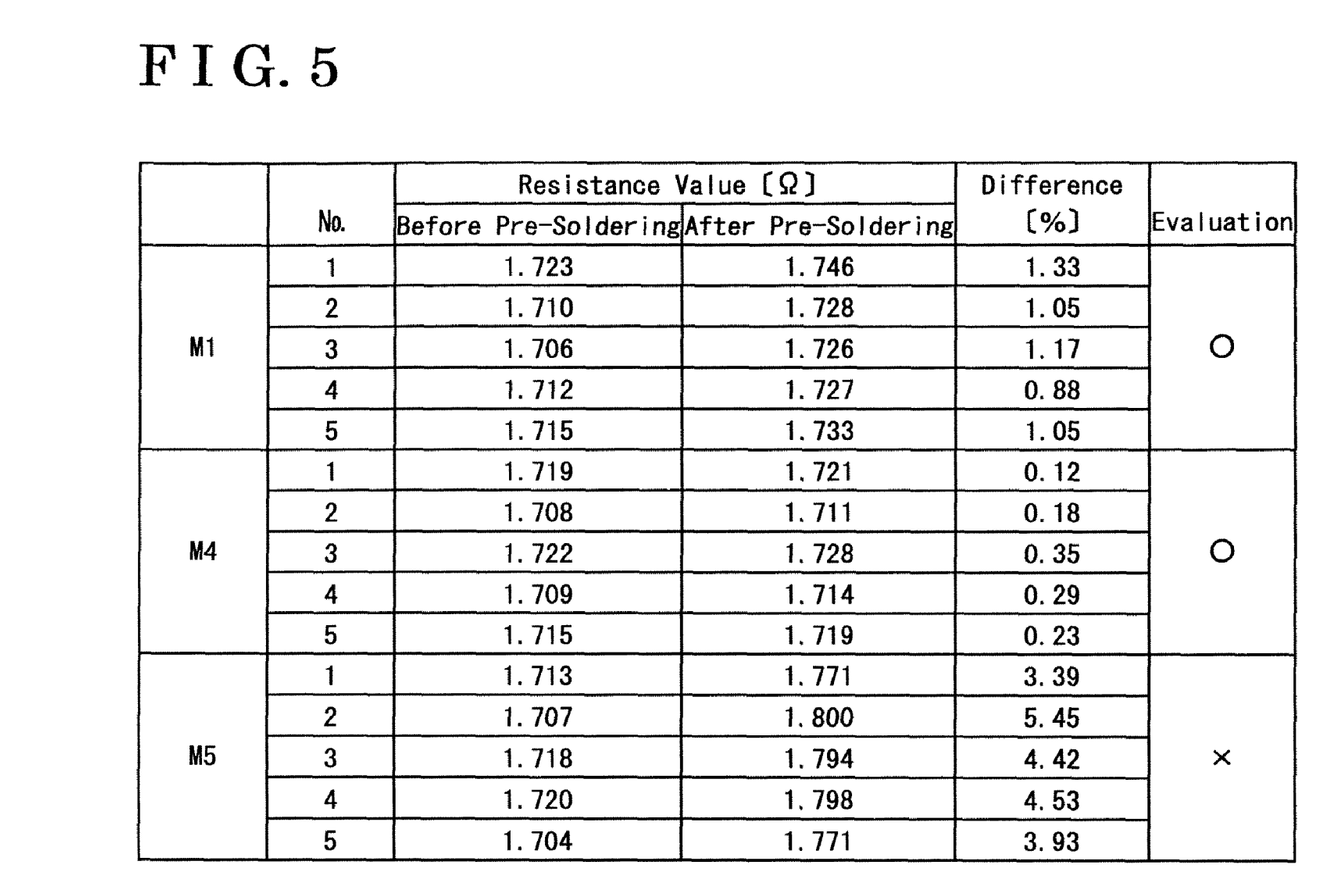
FIG. 5 is a table for explaining the measurement results of how internal resistive values change in the thermoelectric module devices.

The results indicated in FIG. 4—shown and FIG. 5—shown tables reveal that for producing the thermoelectric module device using an Au80/Sn20 solder is preferable for the connection of the Peltier-junction module and using solders such as Sn96.5/Ag3.0/Cu0.5 solder and Sn91/Zn9 solder is preferable which have a coefficient of linear expansion of greater than $20 \times 10^{-6}/K$.

In the above described thermoelectric module device 1, the first substrate 2, which is in one-piece structure, has the connecting portion 2c is more rigid than the power supply portion 2d which is inferior thereto in rigidity and is subject to deform. In such a structure, the metallization layer 7 to be soldered to the package is divided into the spaced or separated first and second portions 7a and 7b to correspond to the respective the connecting portion 2c is more rigid than the power supply portion 2d, thereby reducing the area of the power supply portion 2d of the first substrate 2 which is brought into thermal expansion upon the soldering connection of the thermoelectric module device 1 to the package. Thus, the total amount of thermal stress developed in the first substrate 2, which results in stress reduction applied at each of the connecting portion 2c of the first substrate 2 and the Peltier-junction module 4 per se.

The principles, the preferred embodiments and mode of operation of the present invention have been described in the foregoing specification. However, the invention, which is intended to be protected, is not to be construed as limited to the particular embodiment disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents that fall within the spirit and scope of the present invention as defined in the claims, be embraced thereby.

What is claimed is:

1. A thermoelectric module device comprising:
   a first substrate having inner and outer surfaces;
   a second substrate having inner and outer surfaces, the inner surface of the second substrate being divided into a first region and a second region, the second substrate being arranged in parallel to the first substrate such that the first region of the inner surface of the second substrate is in opposition to the inner surface of the first substrate but the second region of the inner surface of the second substrate is out of opposition to the inner surface of the first substrate to form an extension;
   a Peltier-junction module sandwiched between the inner surface of the first substrate and the first region of the inner surface of the second substrate, the Peltier-junction module being made up of a series of Peltier junctions including a pair of outermost Peltier junctions;
   a pair of power supply electrodes provided on the second region of the inner surface of the second substrate and connected to the pair of the outermost Peltier junctions, respectively; and
   a metallization layer provided on the outer surface of the second substrate for being soldered to a package, the metallization layer being electrically isolated from the pair of power supply electrodes, the metallization layer being divided into spaced first and second portions, the first portion being a single continuous layer which is placed below the first region to correspond to the Peltier-junction module, the second portion being placed below the second region to correspond to the pair of power supply electrodes, a surface area of the first portion being substantially larger than a surface area of the second portion.

2. The thermoelectric module device as set forth in claim 1, wherein the second portion of the metallization layer is divided into a pair of spaced sections corresponding to the pair of power supply electrodes, respectively.

3. The thermoelectric module device as set forth in claim 1, wherein each of the pair of power supply electrodes is a post.

4. The thermoelectric module device as set forth in claim 3, wherein the post extends along a direction of the sandwiching of the Peltier-junction module.

* * * * *